(12) United States Patent
Hofstee et al.

(10) Patent No.: US 6,541,847 B1
(45) Date of Patent: Apr. 1, 2003

(54) PACKAGING FOR MULTI-PROCESSOR SHARED-MEMORY SYSTEM

(75) Inventors: Harm P. Hofstee, Austin, TX (US); Eric A. Johnson, Greene, NY (US); Randall J. Stutzman, Vestal, NY (US); Jamil A. Wakil, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/066,999

(22) Filed: Feb. 4, 2002

(51) Int. Cl.[7] .................. H01L 23/02; H01L 23/34; H01L 23/48; H01L 23/52; H01L 29/40
(52) U.S. Cl. .................. 257/686; 257/723; 257/724; 257/777
(58) Field of Search ................... 257/777, 778, 257/724, 723, 686

(56) References Cited

U.S. PATENT DOCUMENTS

| | | |
|---|---|---|
| 5,760,478 A | 6/1998 | Bozso et al. |
| 6,021,048 A * | 2/2000 | Smith ................... 361/736 |
| 6,023,097 A | 2/2000 | Chiang et al. |
| 6,061,246 A | 5/2000 | Oh et al. |
| 6,091,138 A | 7/2000 | Yu et al. |
| 6,150,724 A | 11/2000 | Wenzel et al. |
| 6,157,541 A | 12/2000 | Hacke |

* cited by examiner

*Primary Examiner*—David E. Graybill
(74) *Attorney, Agent, or Firm*—Schmeiser, Olsen & Watts; Lawrence R. Fraley

(57) ABSTRACT

An electrical structure or package, and associated method of formation. A plurality of logic chips is coupled electrically to a memory chip either through conductive members (e.g., solder balls) that interface with the memory chip and each logic chip, or through a sequential logic-to-memory electrically conductive path that includes: a first conductive member electrically coupled to a logic chip; an electrically conductive via path through a circuitized substrate; and a second conductive member electrically coupled to the memory chip. The logic chips are electrically coupled to the substrate either directly through an interfacing solder interconnection from the logic chip to the substrate, or indirectly through the memory chip such that the memory chip is electrically coupled to the substrate by an interfacing solder interconnect. The electrical structure may be plugged into a socket of a backplane of a circuit card.

20 Claims, 7 Drawing Sheets

PACKAGING FOR MULTI-PROCESSOR SHARED-MEMORY SYSTEM

BACKGROUND OF THE INVENTION

1. Technical Field

The present invention relates to packaging for a multi-processor shared-memory system.

2. Related Art

Multiple chip packages have electrically conductive interconnections therein. Such interconnections, including solder balls, solder columns, etc., are subject to failure due to thermally induced stresses on the interconnections. Thus, there is a need for a multiple chip package having reduced thermally induced stresses on electrically conductive interconnections therein.

SUMMARY OF THE INVENTION

The present invention provides an electrical structure, comprising:
- a circuitized substrate comprising a dielectric material and at least one metal layer;
- a first stiffener coupled to a first surface of the substrate, wherein the first stiffener includes a first stiffener material;
- a second stiffener coupled to a second surface of the substrate, wherein the second stiffener includes a second stiffener material;
- a semiconductor memory chip; and
- N semiconductor logic chips such that N is at least 2, wherein each logic chip is electrically coupled to the memory chip by a direct interconnect path that includes a corresponding conductive member,
  - wherein the corresponding conductive member is in electrical and mechanical contact with both an electrically conductive pad on a surface of the corresponding logic chip and a corresponding electrically conductive pad on a surface of the memory chip,
  - wherein at least one chip selected from the group consisting of the memory chip, a first logic chip of the N logic chips, a second logic chip of the N logic chips, ..., a $N^{th}$ logic chip of the N logic chips, and combinations thereof, is electrically coupled to the substrate by corresponding solder interconnects, and
  - wherein each solder interconnect of the corresponding solder interconnects is in electrical and mechanical contact with both an electrically conductive pad on a surface of the substrate and an electrically conductive pad on a surface of the corresponding chip of the at least one chip.

The present invention provides an electrical structure, comprising:
- a circuitized substrate comprising dielectric material and at least one metal layer;
- a first stiffener coupled to a first surface of the substrate, wherein the first stiffener includes a first stiffener material;
- a second stiffener coupled to a second surface of the substrate, wherein the second stiffener includes a second stiffener material;
- a semiconductor memory chip; and
- N semiconductor logic chips such that N is at least 2, wherein each logic chip is electrically coupled to the memory chip by a corresponding logic-to-memory path that includes a first conductive member, an electrically conductive via path through the substrate, and a second conductive member,
  - wherein the first conductive member and a second conductive member are respectively coupled electrically to opposite ends of the electrically conductive via path,
  - wherein the first conductive member is in electrical and mechanical contact with an electrically conductive pad on a surface of the corresponding logic chip,
  - wherein the second conductive member is in electrical and mechanical contact with an electrically conductive pad on a surface of the memory chip, and
  - wherein each logic chip is electrically coupled to the substrate by at least one of the first conductive member and a third conductive member.

The present invention provides a multiple chip package having reduced thermally induced stresses on electrically conductive interconnections therein.

DETAILED DESCRIPTION OF THE INVENTION

Figure 1:
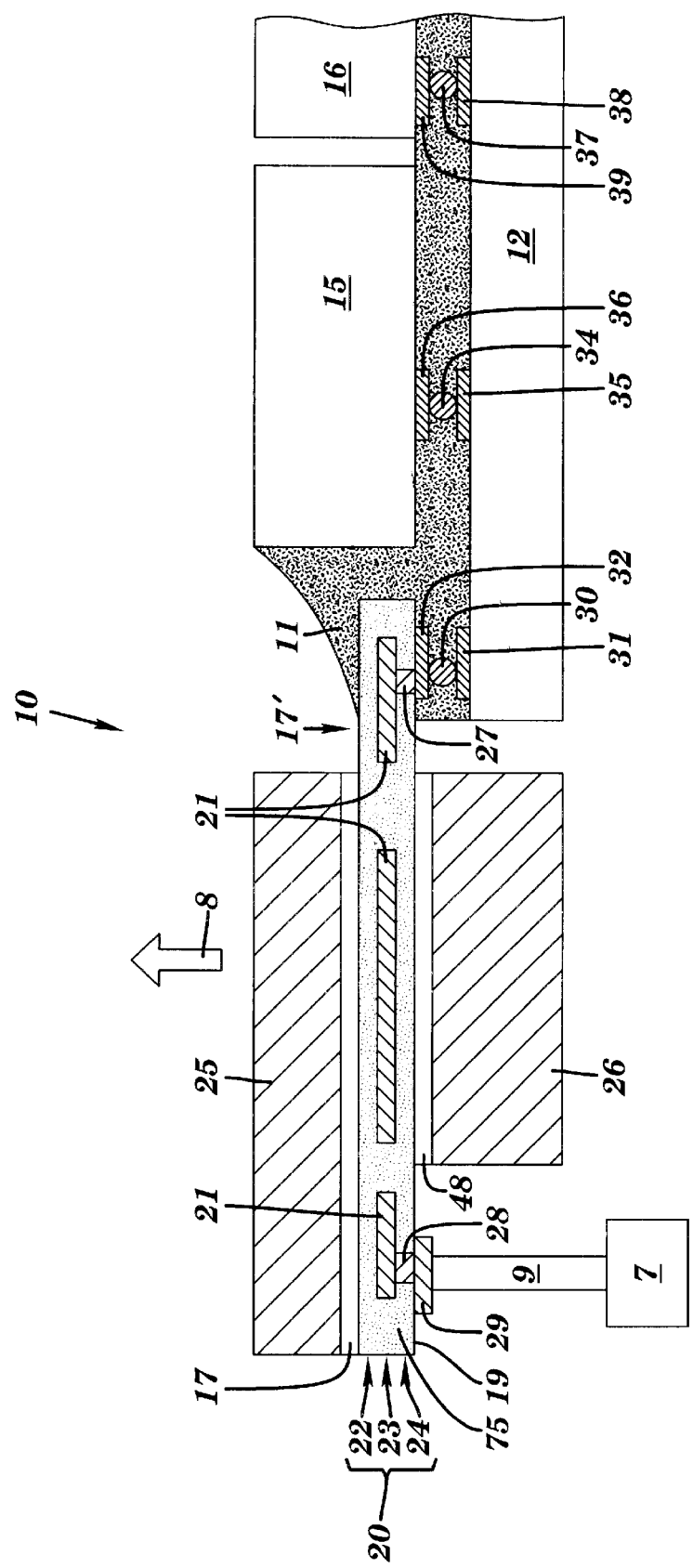
FIGS. 1–3 respectively depict a cross-sectional side view, a top view, and a bottom view of a first electrical structure, in accordance with embodiments of the present invention.
Figure 2:
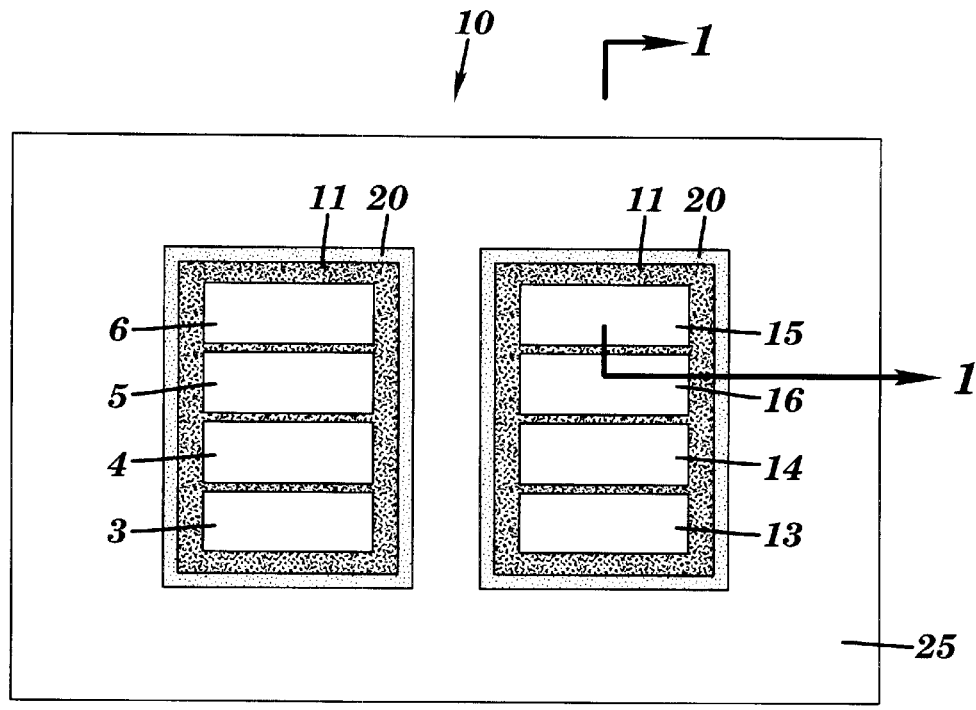
Figure 3:
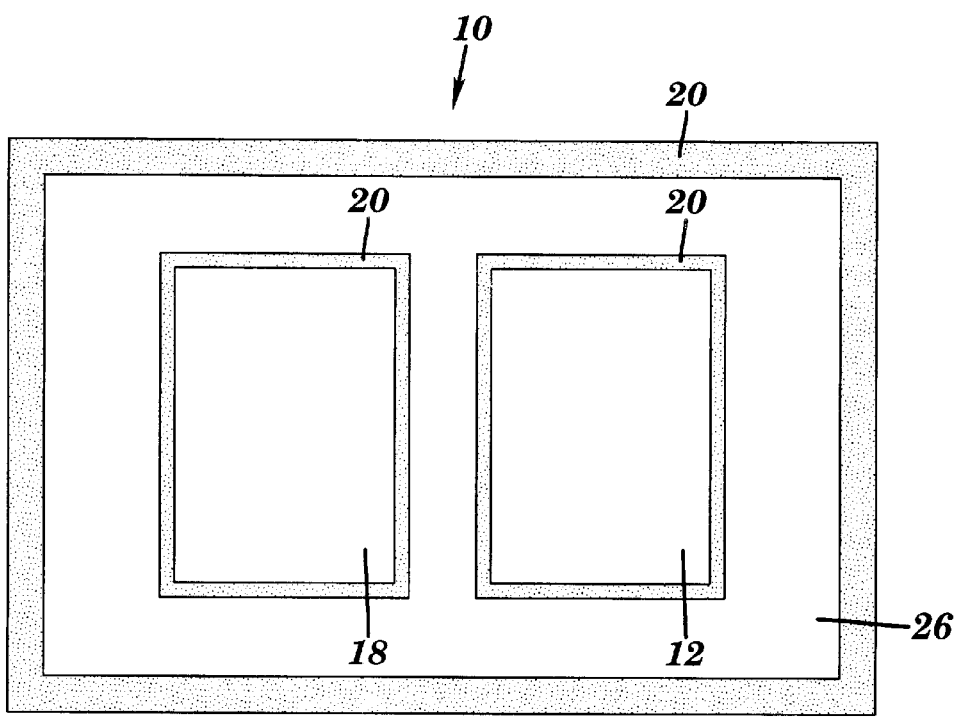

FIGS. 1–3 respectively depict a cross-sectional side view, a top view, and a bottom view of a first electrical structure 10, in accordance with embodiments of the present invention. The cross-sectional side view in FIG. 1 is along a line 1—1 depicted in the top view of FIG. 2.

FIG. 1 shows logic chips 15 and 16 each positioned over a memory chip 12. Generally, at least two such logic chips 15 and 16 are positioned over the memory chip 12. The memory chip 12 is a semiconductor chip such as, inter alia, a dynamic random access memory (DRAM) chip, an enhanced dynamic random access memory (eDRAM) chip, a static random access memory (SRAM) chip, etc. The logic chip 15 is electrically coupled to the memory chip 12 through a solder ball 34 (e.g., a Controlled Collapse Chip Connection (C4) solder ball) which is electrically coupled to electrically conductive pads 36 and 35 of the logic chip 15 and the memory chip 12, respectively. Any electrically conductive interconnect (e.g., a solder column) known to one of ordinary skill in the art may be used instead of the solder ball 34. The term "conductive interconnect", "conductive member", and similar expressions each denote any structural entity (e.g., solder ball, C4 solder ball, solder column, conductive adhesive, etc.) that can be mechanically and electrically connected to an electrically conductive pad by any method (e.g., soldering, adhesive coupling, etc.). The solder ball 34 comprises a direct interconnect path between the logic chip 15 and the memory chip 12. Said direct interconnect path has a length in a direction 8 that is controlled by the size of the solder ball 34. Said direct interconnect path length may be small (e.g., no more than about 4 mils), since it is desirable to limit the electrical path length from the logic chip 15 and the memory chip 12 to a small value in order to increase the speed of electrical communication.

Similarly, the logic chip 16 is electrically coupled to the memory chip 12 through a solder ball 37 which is electrically coupled to electrically conductive pads 39 and 38 of the logic chip 16 and the memory chip 12, respectively. The solder ball 37 comprises a direct interconnect path between the logic chip 16 and the memory chip 12. Said direct interconnect path has a length in the direction 8 that may be small (e.g., no more than about 4 mils), since it is desirable to limit the electrical path length from the logic chip 16 and the memory chip 12 to a small value in order to increase the speed of electrical communication. Thus, the memory chip 12 includes memory cells that may be accessed by any of the at least two logic chips 15 and 16. Wiring on the memory chip 12 (said wiring not shown) also connects the at least two logic chips 15 and 16 together.

FIG. 1 also shows a circuitized substrate 20 comprising a metal layer 23 between a dielectric layer 22 and a dielectric layer 24. The substrate 20 may include, inter alia, a chip carrier or a circuit card. A single metal layer 23 is shown as internal to the substrate 20 and includes electrically conductive metal (or metallic alloy) 21 such as, inter alia, copper, alloy 42, or aluminum. Alternatively, the metal layer 23 may be located on an external surface (e.g., a surface 19) of the substrate 20. The metal layer 23 may include any combination of power, ground traces. The dielectric layers 22 and 24 each comprise a dielectric material 75, such as, inter alia, polyimide, epoxy-glass composite, FR4, alumina, ceramic, polytetrafluoroethylene, BT resin, etc. While 2 dielectric layers and 1 metal layer are shown for the substrate 20 in FIG. 1, the substrate 20 includes any number of dielectric layers and metal layers, and the metal layers may include any combination of power planes, ground planes, and signal planes. The substrate 20 may also include any number of electrically conductive interconnects (e.g., conductively plated/filled through holes or blind vias) as are known to persons of ordinary skill in the art.

The substrate 20 may be electrically coupled to a signal line or electrically conductive pad 29 on an uncovered portion of a surface 19 of the substrate 20 by an electrically conductive interconnect (plated/filled blind via) 28. An electrical connector 9 may electrically couple the signal line/pad 29 to any desired electrically conductive structure, such as, inter alia, an electrical device 7 (e.g., an input/output device).

The substrate 20 is electrically coupled to the memory chip 12 through a solder ball 30. The solder ball 30 is electrically coupled to electrically conductive pads 32 and 31 of the substrate 20 and the memory chip 12, respectively. The pad 32 is electrically coupled to the metal 21 by an electrically conductive interconnect (e.g., plated/filled blind via) 27. Thus, the logic chip 15 is electrically coupled to the substrate 20 through the following path: pad 36, solder ball 34, pad 35, wiring on the memory chip 12, pad 31, solder ball 30, and pad 32. The logic chip 15 may thus be electrically coupled to an external device connected to the signal line/pad 29 by being coupled to the substrate 20 as described supra and then through: the interconnect 27, the metal 21 of the metal layer 23, the interconnect 28, and the signal line/pad 29. Similarly, the logic chip 16 may be electrically coupled to the substrate 20 and the external device connected to the signal line/pad 29 by connection to the memory chip 12 through use of the pad 39, the solder ball 37, and the pad 38, followed by the same connections to the substrate 20 and the signal line/pad 29 as was described supra for the logic chip 15. The logic chips 15 and 16 have no direct electrical connection to the substrate 20 and the external device connected to the signal line/pad 29, but have an indirect electrical connection to the substrate 20 and the external device connected to the signal line/pad 29 through the memory chip 12 as described supra.

FIG. 1 also shows an underfill 11 encapsulating the solder balls 30, 34, and 37. The underfill 11 serves to provide structural support for the solder balls 30, 34, and 37 particularly when the solder balls 30, 34, and 37 are subject to thermal stresses. The underfill 11 may include, inter alia, Namics 8437-3 available from Namics Corporation.

The electrical structure 10 also includes an upper stiffener 25 and a lower stiffener 26, each coupled to the substrate 20 by an adhesive layer 17 and an adhesive layer 48, respectively. The adhesive layers 17 and 48 may include a same or different adhesive materials. Such adhesive materials may include polymers with relatively high moduli (e.g., >1 GPa), such as epoxies. The upper stiffener 25 and the lower stiffener 26 provide structural stability to the substrate 20. There may be openings in the adhesive layers 17 and 48 so that the stiffeners 25 and 26, if conductive, can be grounded to the substrate 20 using conductive adhesive in the openings. If the substrate 20 has a single metal layer (e.g., the metal layer 23) then the grounding of the conductive stiffeners 25 and 26 may utilize unplated through holes in the substrate 20, such that the unplated through holes are filled with conductive adhesive during lamination of the substrate 20. Alternatively, the entire adhesive layers 17 and 48 may be electrically conductive. If the substrate 20 has wiring on its external surface(s), then the electrically conductive adhesive layers 17 and 48 may be insulated from signal lines in the substrate 20 by a solder mask on the substrate 20 external surface(s). Another alternative is to omit the adhesive layers 17 and 48 and instead have the stiffeners 25 and 26 include a plastic molding material such that the stiffeners 25 and 26 are molded directly to the substrate 20 (see, e.g., FIG. 4 described infra in which stiffeners 125 and 126 include a plastic molding material such that the stiffeners 125 and 126 are molded directly to a substrate 120).

FIG. 2 depicts a top view of the electrical structure 10 and shows the line 1—1 line used to defined the cross-sectional side view of FIG. 1. FIG. 2 shows a first group of logic chips 13, 14, 15, and 16 organized as a linear array of logic chips, each of said logic chips 13–16 connected to the common, shared memory chip 12 (not shown in FIG. 2 but shown in FIG. 1 for the logic chips 15 and 16, and also shown in FIG. 3). A portion of the underfill 11 is shown in FIG. 2 as surrounding the logic chips 13–16 and being surrounded by a portion of the substrate 20. FIG. 2 also shows a second group of logic chips 3, 4, 5, and 6 organized as a linear array of logic chips, each of said logic chips 3–6 connected to a common, shared memory chip 18 (not shown in FIG. 2 but shown in FIG. 3). A portion of the underfill 11 is shown in FIG. 2 as surrounding the logic chips 3–6, and being surrounded by a portion of the substrate 20. The upper stiffener 25 is shown as having cavities into which the first group of logic chips 13–16 and the second group of logic chips 3–6 have been placed.

FIG. 3 depicts a bottom view of the electrical structure 10 showing the memory chip 12 which is underneath the first group of logic chips 13–16 and the second group of logic chips 3–6 (see FIG. 2). The lower stiffener 26 is shown as having cavities into which the memory chips 12 and 18 have been placed. A portion of the substrate 20 is shown as surrounding the memory chips 12 and 18 as well as surrounding the lower stiffener 26. The signal line/pad 29, electrical connector 9, and electrical device 7 (see FIG. 1) have been omitted from FIG. 3.

Figure 10:
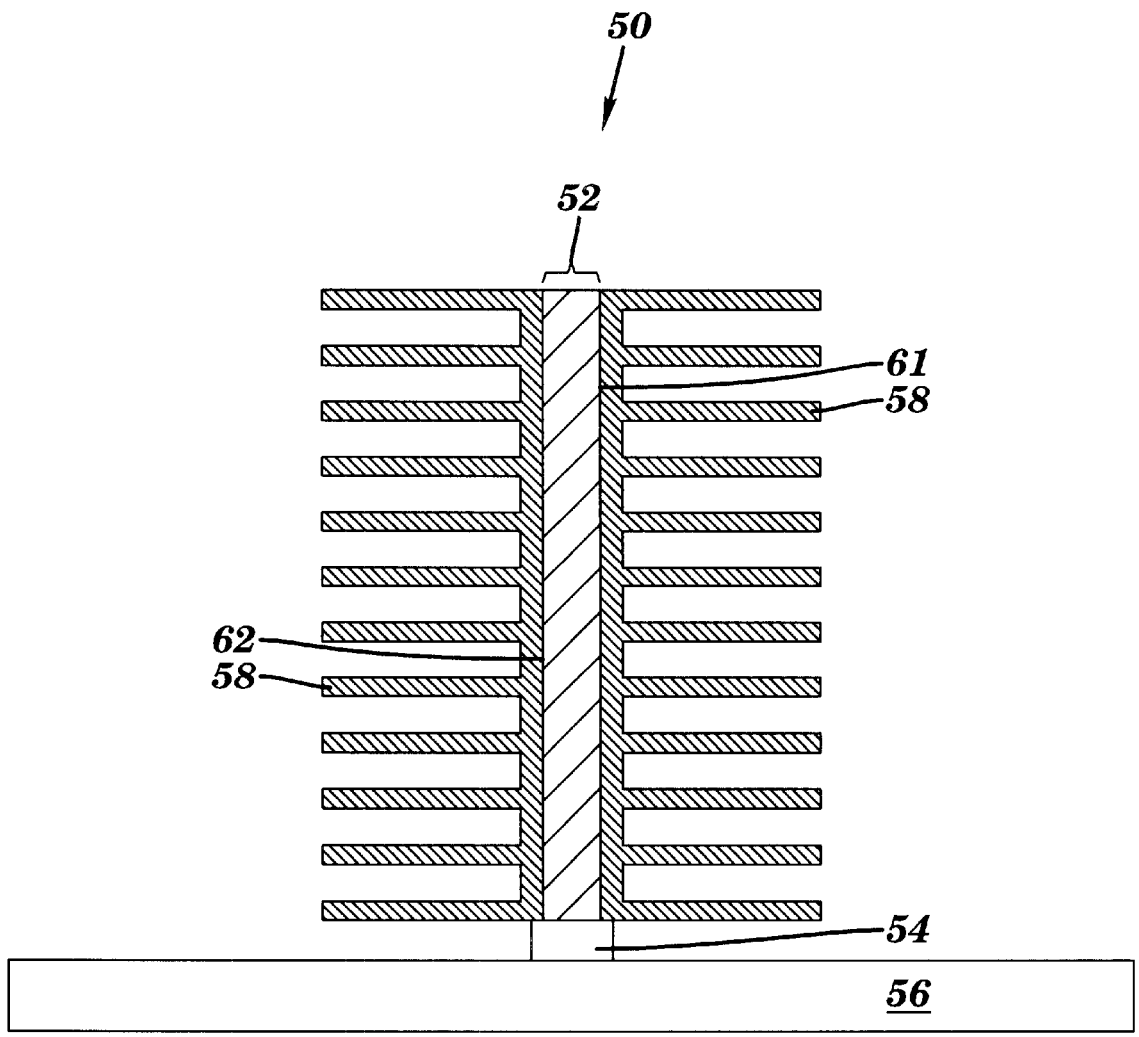
FIG. 10 depicts the electrical structure of FIGS. 1–3, 4–6, or 7–9 plugged into a socket of a backplane of circuit card, in accordance with embodiments of the present invention.

The electrical structure 10 may have attached heat sinks or cover plates from above and below. Such heat sinks or cover plates have been omitted from FIGS. 2 and 3, but are illustrated in FIG. 10 (to be described infra).

Returning to FIG. 1, the solder ball 30 is subject to thermally induced stress during operation due to a difference in coefficient of thermal expansion (CTE) between the memory chip 12 and the substrate 20 and/or stiffeners 25 and 26. The thermally induced stresses threaten the structural integrity of the electrical coupling of the solder ball 30 to the substrate 20 and to the memory chip 12. The present invention mitigates such thermal stresses in various ways. A first way of mitigating the thermal induced stress on the solder ball 30 is to match the coefficient of thermal expansion (CTE) of the stiffeners 25 and 26 to the CTE of the memory chip 12. A CTE range of 6 to 10 ppm/° C. for the stiffeners 25 and 26 will provide satisfactory fatigue life for most applications if the memory chip 12 has a CTE between about 3 and 6 ppm/° C. Thus, the stiffeners 25 and 26, as coupled to the substrate 20 by the adhesive layers 17 and 48, respectively, may include such materials as, inter alia, Invar, alloy 42, 420 stainless steel, and AlSiC, each of which having a CTE between about 6 and 10 ppm/° C. If the stiffeners 25 and 26 include plastic and are molded to the substrate 20, such plastic of the stiffeners 25 and 26 may include a plastic and are molded to the substrate 20, such plastic of the stiffeners 25 and 26 may include a plastic material that has a CTE between about 6 and 10 ppm/° C., such as inter alia, CEL-9200-XU molding compound from Hitachi Ltd. The stiffeners 25 and 26 may comprise a same material or a different material.

A second way of mitigating the thermally induced stress on the solder ball 30 is to make the substrate 20 sufficiently flexible so as to accommodate most of the thermally induced stress and thus reduce the thermal stress on the solder ball 30. The substrate 20 may be made sufficiently flexible by using a highly compliant dielectric material (e.g., a polyimide such as KAPTON® made by E.I. DuPont De Nemours and Company Corporation) in the dielectric layers 22 and 24 of the substrate 20 and/or making the substrate 20 sufficiently thin. For example, an epoxy-glass substrate 20 may have a thickness less than about three mils in the direction 8. The substrate 20 is sufficiently compliant if its in-plane stiffness per unit length and width is less than about $1.5 \times 10^9$ gm/sec$^2$.

A third way of mitigating thermally induced stress on the solder ball 30 is to use no more than one single metal layer in the region 17' of the substrate 20 between the stiffener 25 and the logic chip 15.

The electrical structure 10 of FIGS. 1–3 may be assembled as follows. The stiffeners 25 and 26, with cavities for the chips, are attached adhesively or by molding, to the substrate 20. The memory chip 12 is attached to the substrate 20 such that if soldering of the solder ball 30 is used rather than thermal compression bonding then the melting point of the solder ball 30 is higher than any temperature used in subsequent processing steps. An area in the substrate 20 is to the corresponding memory chips 12 and 18, respectively. Then the logic chips 13–16 and 3–6 (including solder balls 34, 37, etc.) are assembled to the electrical structure 10 by reflowing the solder balls 34, 37, etc. The solder balls 30, 34, 37, etc. are encapsulated by the underfill 11. Heat sinks (see FIG. 10) may be added to both sides or surfaces of the electrical structure 10.

Figure 4:
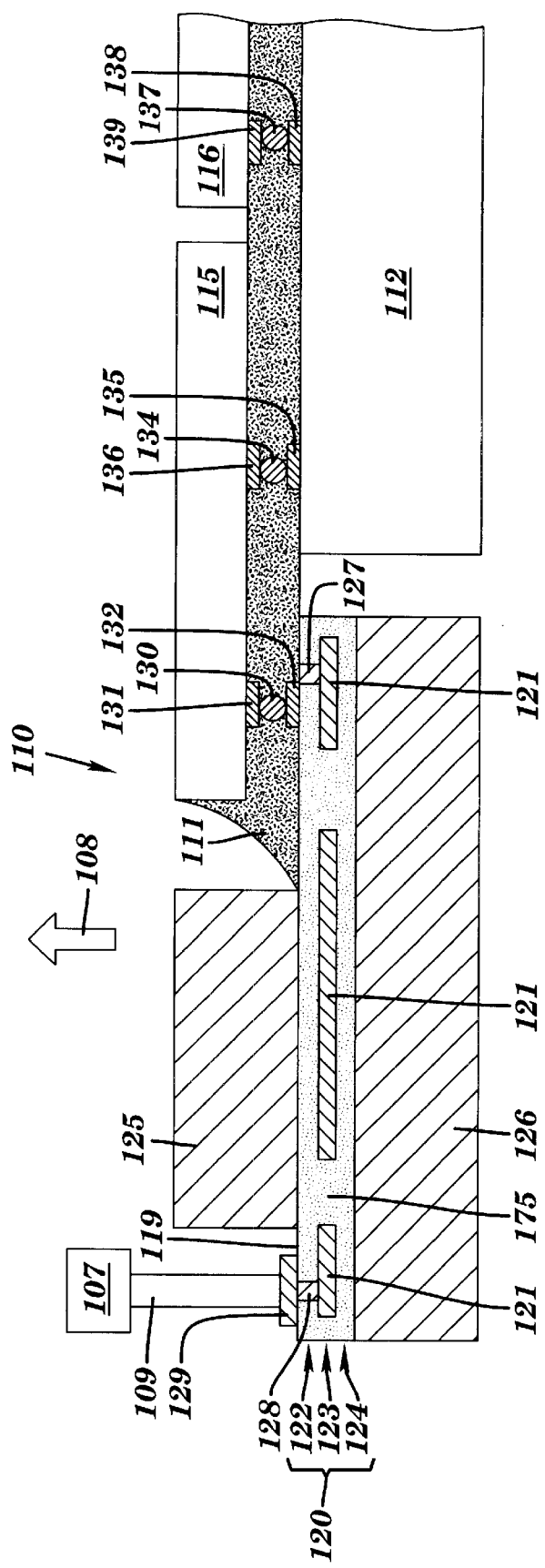
FIGS. 4–6 respectively depict a cross-sectional side view, a top view, and a bottom view of a second electrical structure, in accordance with embodiments of the present invention.
Figure 5:
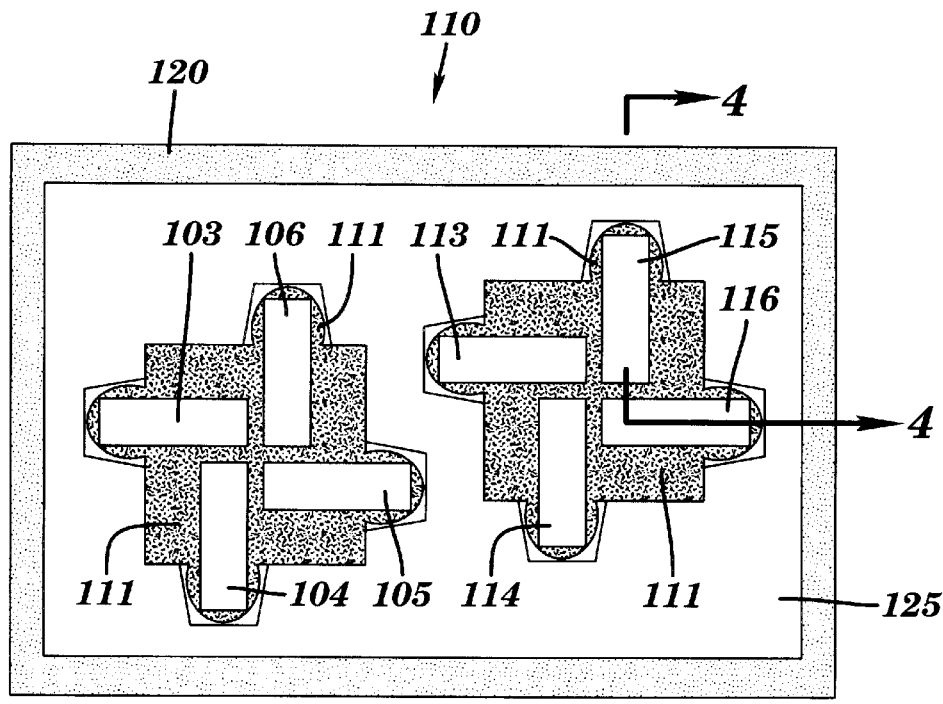
Figure 6:
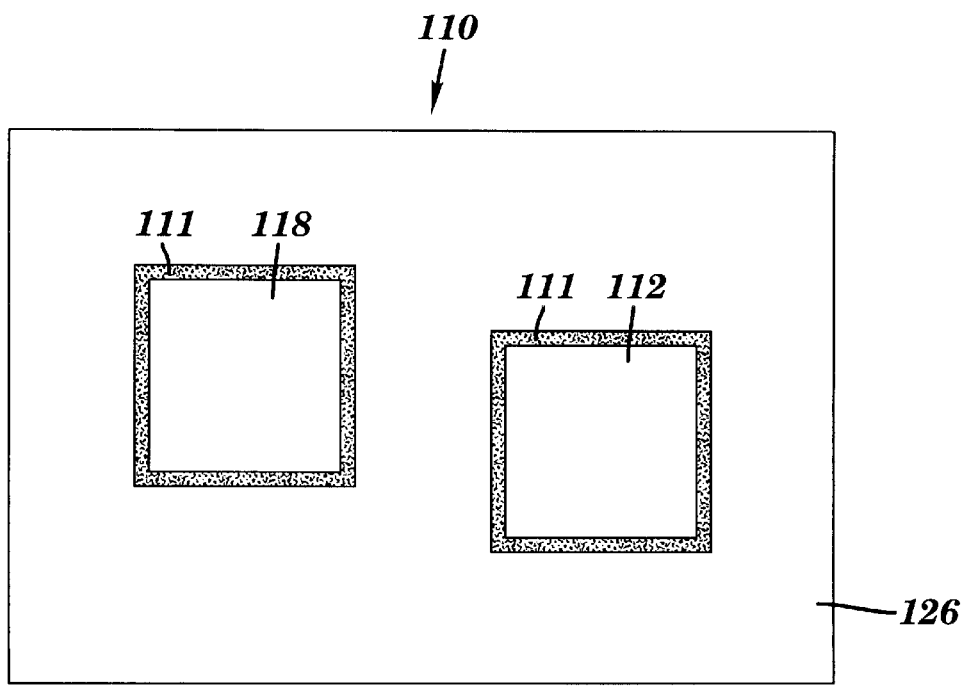

FIGS. 4–6 respectively depict a cross-sectional side view, a top view, and a bottom view of a second electrical structure 110, in accordance with embodiments of the present invention. The cross-sectional side view in FIG. 4 is along a line 4—4 depicted in the top view of FIG. 5.

FIG. 4 shows logic chips 115 and 116 each positioned over a memory chip 112. Generally, at least two such logic chips 115 and 116 are positioned over the memory chip 112. The memory chip 112 is a semiconductor chip such as, inter alia, a DRAM chip, an eDRAM chip, a SRAM chip, etc. The logic chips 115 and 116 are semiconductor chips that may include, inter alia, processor chips. The logic chip 115 is electrically coupled to the memory chip 112 through a solder ball 134 (e.g., a C4 solder ball) which is electrically coupled to electrically conductive pads 136 and 135 of the logic chip 115 and the memory chip 112, respectively. Any electrically conductive interconnect (e.g., a solder column) known to one of ordinary skill in the art may be used instead of the solder ball 134. The solder ball 134 comprises a direct interconnect path between the logic chip 115 and the memory chip 112. Said direct interconnect path has a length in a direction 108 that is controlled by the size of the solder ball 134. Said direct interconnect path length may be small (e.g., no more than about 4 mils), since it is desirable to limit the electrical path length from the logic chip 115 and the memory chip 112 to a small value in order to increase the speed of electrical communication. small value in order to increase the speed of electrical communication.

Similarly, the logic chip 116 is electrically coupled to the memory chip 112 through a solder ball 137 which is electrically coupled to electrically conductive pads 139 and 138 of the logic chip 116 and the memory chip 112, respectively. The solder ball 137 comprises a direct interconnect path between the logic chip 116 and the memory chip 112. Said direct interconnect path has a length in the direction 108 that may be small (e.g., no more than about 4 mils), since it is desirable to limit the electrical path length from the logic chip 116 and the memory chip 112 to a small value in order to increase the speed of electrical communication. Thus, the memory chip 112 includes memory cells that may be accessed by any of the at least two logic chips 115 and 116. Wiring on the memory chip 112 (said wiring not shown) may also connect the at least two logic chips 115 and 116 together.

FIG. 4 also shows a circuitized substrate 120 comprising a metal layer 123 between a dielectric layer 122 and a dielectric layer 124. The substrate 120 may include, inter alia, a chip carrier or a circuit card. A single metal layer 123 is shown which is internal to the substrate 120 and includes electrically conductive metal 121 such as, inter alia, copper, Invar, alloy 42, aluminum, etc. Alternatively, the metal layer 123 may located on an external surface (e.g. a surface 119) of the substrate 120. The metal layer 123 may include any combination of power, signal and ground traces. The dielectric layers 122 and 124 each comprise a dielectric material 175, such as, inter alia, polyimide, epoxy-glass composite, FR4, alumina, ceramic, polytetrafluoroethylene, BT resin, etc. While 2 dielectric layers and 1 metal layer are shown for the substrate 120 in FIG. 4, the substrate 120 may include any number of dielectric layers and and signal planes. The substrate 120 may also include any number of electrically conductive interconnects (e.g., conductively plated/filled through holes or blind vias) as are known to persons of ordinary skill in the art.

The substrate 120 may be electrically coupled to a signal line or electrically conductive pad 129 on an uncovered portion of the surface 119 of the substrate 120 by an electrically conductive interconnect (plated/filled blind via) 128. An electrical connector 109 may electrically couple the signal line/pad 129 to any desired electrically conductive structure, such as, inter alia, an electrical device 107 (e.g., an input/output device).

The logic chip 115 is electrically coupled to the substrate 120 through a solder ball 130 which is electrically coupled to electrically conductive pads 131 and 132 of the logic chip 115 and the substrate 120, respectively. The pad 132 is electrically coupled to the metal 121 by an electrically conductive interconnect (e.g., plated/filled blind via) 127. Therefore, the logic chip 115 may be directly electrically coupled to the substrate 120 and to an external device connected to the signal line/pad 129 by being coupled to the substrate 120 as described supra and then through: the interconnect 127, the metal 121, the interconnect 128, and the signal line/pad 129. The logic chip 116 may be similarly directly electrically coupled to the substrate 120 and to an external device connected to a signal line/pad on substrate 120, using interconnections with a portion of the substrate 120 that is not shown in FIG. 4 but is inferred from FIG. 5.

FIG. 4 also shows an underfill 111 encapsulating the solder balls 130, 134, and 137. The underfill 111 serves to provide structural support for the solder balls 130, 134, and 137 particularly when the solder balls 130, 134, and 137 are subject to thermal stresses.

A difference between the electrical structure 10 of FIG. 1 and the electrical structure 110 of FIG. 4 is that the logic chip 15 of FIG. 1 is indirectly electrically coupled by the memory chip 12 to the substrate 20 and to the external device connected to the signal line/pad 29, while the logic chip 115 of FIG. 4 is directly electrically coupled by the solder ball 130 to the substrate 120 and to the external device connected to the signal line/pad 129.

The electrical structure 110 of FIG. 4 also includes an upper stiffener 125 and a lower stiffener 126, each of which may be made from a thermoset plastic that is transfer-molded to the substrate 120. The upper stiffener 125 and the lower stiffener 126 provide structural stability to the substrate 120. Alternatively the stiffeners 125 and 126 may each be adhesively coupled to the substrate 120 by use of adhesive layers such as the adhesive layers 17 and 48 that coupled the stiffeners 25 and 26, respectively, to the substrate 20 of FIG. 1. If the stiffeners 125 and 126 of FIG. 4 are adhesively coupled to the substrate 120 by adhesive layers, such adhesive layers may have any of the characteristics described supra for the adhesive layers 17 and 48 of FIG. 1. The stiffeners 125 and 126 of FIG. 4 may include any of the features and materials (metal or plastic) described supra for the stiffeners 25 and 26 of FIG. 1.

FIG. 5 depicts a top view of the electrical structure 110 and shows the line 4—4 used to defined the cross-sectional side view of FIG. 4. FIG. 5 shows a first group of logic chips 113, 114, 115, and 116 organized with adjacent logic chips at right angles to each other, each of said logic chips 113–116 connected to the common, shared memory chip 112. A portion of the underfill 111 is shown in FIG. 5 as surrounding one end of each of the logic chips 113–116. FIG. 5 also shows a second group of logic chips 103, 104, 105, and 106 organized with adjacent logic chips at right angles to each other, each of said logic chips 103–106 connected to a common, shared memory chip 118. A portion of the underfill 111 is shown in FIG. 5 as surrounding one end of each of the logic chips 103–106. The upper stiffener 125 is shown as having cavities into which the first group of logic chips 113–116 and the second group of logic chips 103–106 have been placed. A portion of the substrate 120 is shown as surrounding the upper stiffener 125.

FIG. 6 depicts a bottom view of the electrical structure 110 showing the memory chip 112 which is underneath the first group of logic chips 113–116, and the memory chip 118 which is underneath the second group of logic chips 103–106 (see FIG. 5). The lower stiffener 126 is shown as having cavities into which the memory chips 112 and 118 have been placed. The signal line/pad 129, the electrical connector 109, and electrical device 107 (see FIG. 4) have been omitted from FIG. 6.

The electrical structure 110 may have attached heat sinks or cover plates from above and below. Such heat sinks or cover plates have been omitted from FIGS. 5 and 6, but are illustrated in FIG. 10 (to be described infra).

Returning to FIG. 4, the solder ball 130 is subject to thermally induced stress during operation due to a difference in CTE between the interconnected memory and logic chips (112 and 113–116, respectively) and the substrate 120 and/or stiffeners 125 and 126. The thermally induced stresses threaten the structural integrity of the electrical coupling of the solder ball 130 to the substrate 120 and to the logic chip 115. The present invention mitigates such stresses by matching the CTE of the stiffeners 125 and 126 to the CTE of the logic chip 115. A CTE range of 6 to 10 ppm/° C. for the stiffeners 125 and 126 will provide satisfactory fatigue life for most applications if interconnected memory and logic and logic chips (112 and 113–116) have a CTE between about 3 and 6 ppm/° C. Thus, the stiffeners 125 and 126, as molded to the substrate 120, may include a plastic material that has a CTE between about 6 and 10 ppm/° C., such as inter alia, CEL-9200-XU molding compound from Hitachi Ltd. If the stiffeners 125 and 126 are coupled to the substrate 120 by adhesive layers (e.g., the adhesive layers 17 and 48 of FIG. 1), then the stiffeners 125 and 126 may include such materials as, inter alia, Invar, alloy 42, 420 stainless steel, and AlSiC, each of which having a CTE between about 6 and 10 ppm/° C. The stiffeners 125 and 126 may comprise a same material or a different material.

An important distinction between the electrical structure 110 shown in FIG. 4 and the electrical structure 10 shown in FIG. 1 is the support of the substrate 120 by one of the stiffeners, 125 or 126 over its entire surface extending directly beneath the solder ball 130. The relatively low CTE of the stiffeners 125 and 126 constrains the substrate 120, which reduces its composite CTE to more closely match the CTE of logic chips 113–116 (see FIG. 5). This reduction in the CTE mismatch between substrate 120 and logic chips 113–116, along with the support provided by the underfill 111, reduces strain in the solder joints (e.g., solder balls 130, 134, etc.)

The electrical structure 110 of FIGS. 4–6 may be assembled as follows. The stiffeners 125 and 126 are attached, adhesively or by molding, to the substrate 120. The opening in the substrate may be made at any time prior to attaching the memory chips 112 and 118 by machining, laser ablation or other process. The logic chips 113–116 and 103–106 are attached to the substrate 120 such that if soldering is used rather than conductive adhesive, then the melting point of the solder is higher than any temperature used in subsequent processing steps. Then the memory chips 112 and 118 are assembled to the electrical structure 110 by reflowing the solder balls 134, 137, etc. The solder balls 130, 134, 137, etc. are encapsulated by the underfill 111. Heat sinks (see FIG. 10) may be added to both sides or surfaces of the electrical structure 110. To facilitate correct spacing of the pads 136 and 139 on the logic chips 115 and 116 so as to correctly align with corresponding pads 135 and 138 on the memory chip 112, the logic chips 115 and 116 may be temporarily mounted with their inactive sides on a temporary carrier, and a water soluble adhesive such as a vinyl ester resin can be used for this purpose. This temporary carrier can be removed after the memory chip 112 has been attached to the logic chips 115 and 116. Instead of the temporary carrier, a heat spreader can alternatively be permanently attached to the logic chips 115 and 116 and subsequently to either of the stiffeners 125 or 126.

Figure 7:
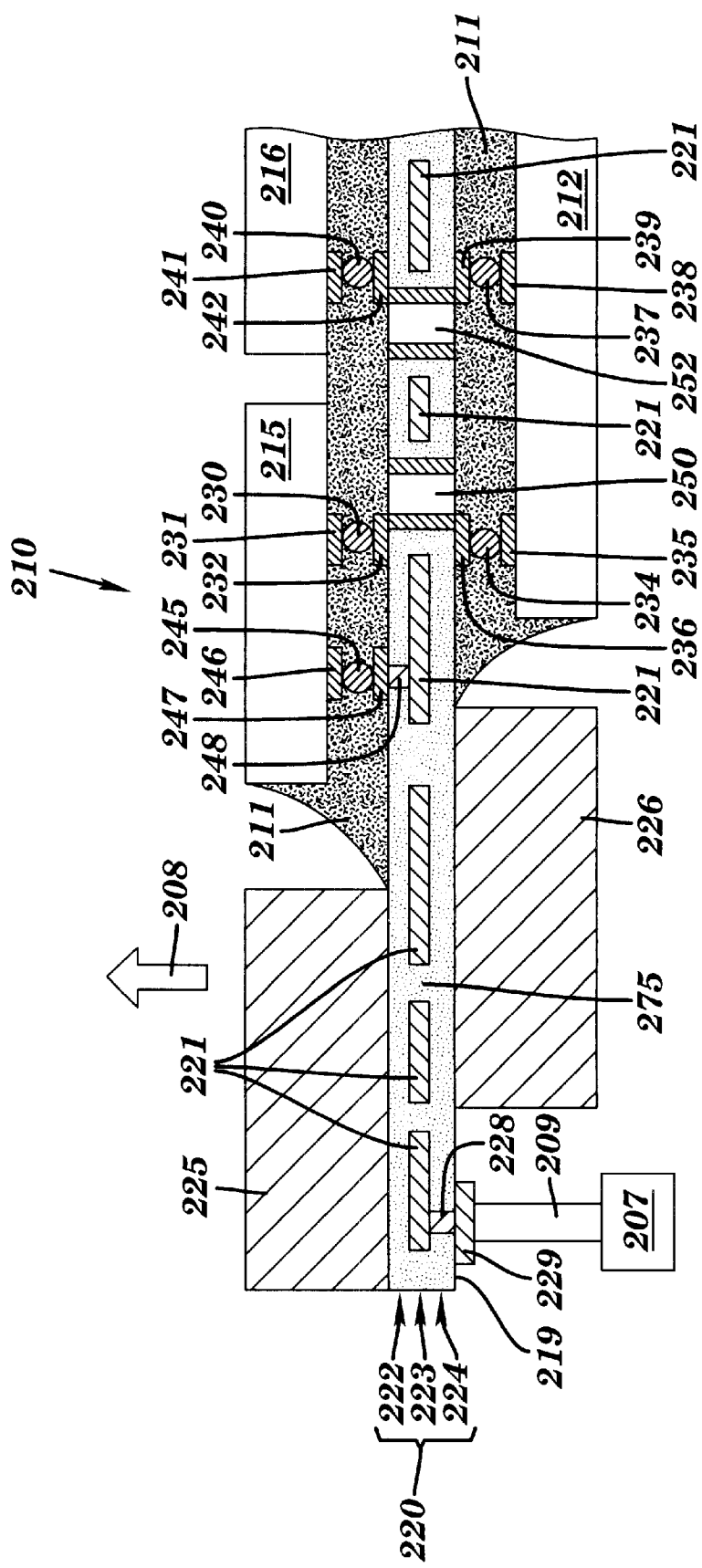
FIGS. 7–9 respective cross-sectional side view, a top view, and a bottom view of a third electrical structure, in accordance with embodiments of the present invention.
Figure 8:
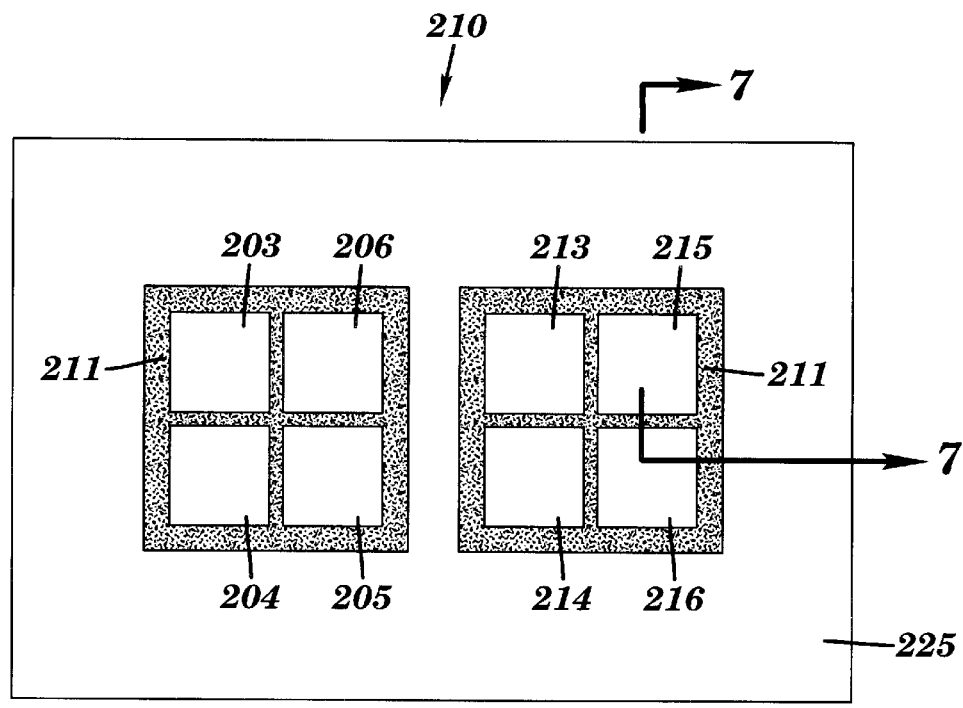
Figure 9:
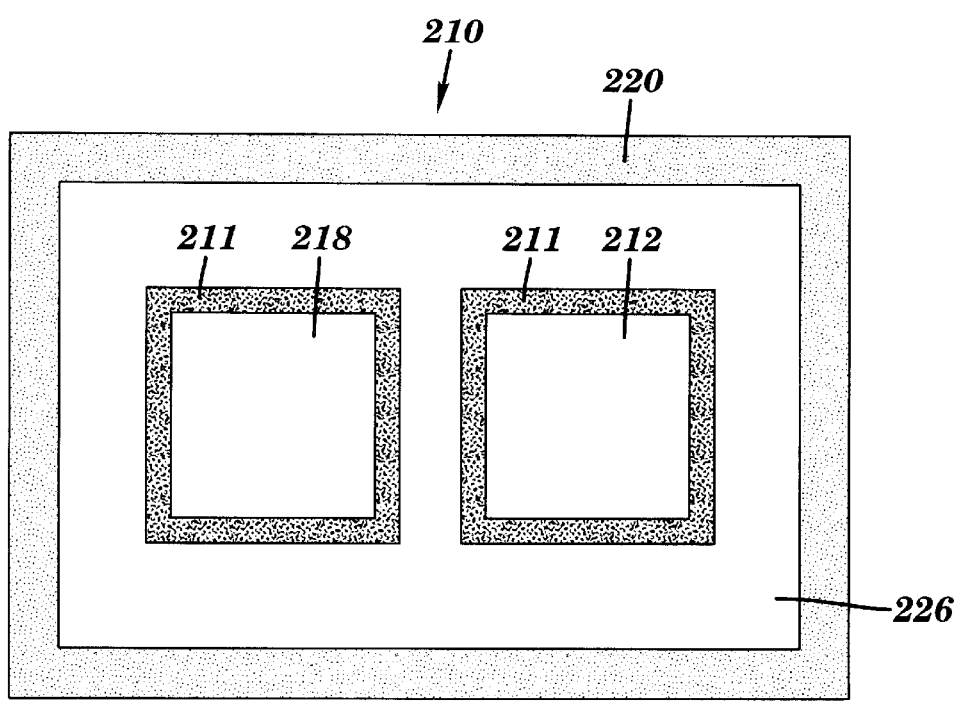

FIGS. 7–9 respectively depict a cross-sectional side view, a top view, and a bottom view of a third electrical structure 210, in accordance with embodiments of the present invention. The cross-sectional side view in FIG. 7 is along a line 7—7 depicted in the top view of FIG. 8.

FIG. 7 shows logic chips 215 and 216 each separated from a memory chip 212 by a circuitized substrate 220. Generally, at least two such logic chips 215 and 216 are separated from the memory chip 212 by the circuitized substrate 220. The memory chip 212 is a semiconductor chip such as, inter alia, a DRAM chip, an eDRAM chip, a SRAM chip, etc. The logic chips 215 and 216 are semiconductor chips that may include, inter alia, processor chips. The logic chip 215 is electrically coupled to the substrate 220 through a solder ball 230 (e.g., a C4 solder ball) which is electrically coupled to electrically conductive pads 231 and 232 of the logic chip 215 and the substrate 220, respectively. Any electrically conductive interconnect (e.g., a solder column, conductive adhesive) known to one of ordinary skill in the art may be used instead of the solder ball 230. Similarly, the logic chip 216 is electrically coupled to the substrate 220 through a solder ball 240 (e.g., a C4 solder ball) which is electrically coupled to electrically conductive pads 241 and 242 of the logic chip 216 and the substrate 220, respectively.

The substrate 220 is electrically coupled to the memory chip 212 through a solder ball 234 (e.g., a C4 solder ball) which is electrically coupled to electrically conductive pads 235 and 236 of the memory chip 212 and the substrate 220, respectively. Additionally, the substrate 220 is electrically coupled to the memory chip 212 through a solder ball 237 (e.g., a C4 solder ball) which is electrically coupled to electrically conductive pads 238 and 239 of the memory chip 212 and the substrate 220, respectively.

The pad 232 is electrically coupled to the pad 236 by a conductively plated through via 250 through the thickness in a direction 208 of the substrate 220. As an alternative, the via 250 could be unplated but filled with an electrically conductive material. Thus, the logic chip 215 is electrically coupled to the memory chip 212 by the following "logic-to-memory path": pad 231, solder ball 230, pad 232, via 250, pad 236, solder ball 234, and pad 235. Said logic-to-memory path has a length in the direction 208 that may be small (e.g. 13 mils, including 5 mils for the via 250 and 4 mils for each of the solder balls 230 and 234), since it is desirable to limit the electrical path length from the logic chip 215 and the memory chip 212 to a small value in order to increase the speed of electrical communication. Alternatively, the through via 250 could be replaced by a first electrically conductive plated/filled blind via electrically connected to the pad 232, and a second electrically conductive plated/filled blind via electrically connected to the pad 236, wherein the first and second plated/filled blind vias are electrically coupled to each other by the metal 221 and wherein the pads 232 and 236 may or may not be aligned with respect to each other (i.e., offset) in the direction 208.

The term "electrically conductive via path" defines an electrically conductive path of one or more vias that electrically couple the pads 232 and 236. Thus a first example of an electrically conductive via path comprises the through via 250. A second example of an electrically conductive via path comprises the aforementioned path that includes the first and second plated/filled blind vias.

The logic chip 215 may be electrically coupled to the substrate 220 by the solder ball 230 coupled to the pad 232 such that the pad 232 is in electrical contact with the through via 250, the electrically conductive plated/filled blind via (described supra), or both. The logic chip 215 may be alternatively or additionally electrically coupled to the substrate 220 by a solder ball 245, wherein the solder ball 245 is electrically coupled to a pad 246 on the logic chip 215 and to a pad 247 on the substrate 220, and wherein the pad 247 is electrically coupled to the metal 221 by a plated/filled blind via 248. Thus, the logic chip 215 is electrically coupled: to the metal 221, then to an electrically conductive interconnect (e.g., plated/filled blind via) 228, and then to a signal line/electrically conductive pad 229 on a surface 219 of the substrate 220.

Similarly, the pad 242 is electrically coupled to the pad 239 by a conductively plated through via 252 through the thickness of the substrate 220 in the direction 208. As an alternative, the via 252 could be filled with an electrically conductive material. Thus, the logic chip 216 is electrically coupled to the memory chip 212 by the following "logic-to-memory path": pad 241, solder ball 240, pad 242, via 252, pad 239, solder ball 237, and pad 238. Said logic-to-memory path has a length in the direction 208 that is may be small (e.g. 13 mils). Alternatively, the through via 252 could be replaced by a third plated/filled blind via electrically connected to the pad 242, and a fourth plated/filled blind via electrically connected to the pad 239, wherein the third and fourth plated/filled blind vias are electrically coupled to each other by the metal 221 and wherein the pads 242 and 239 may or may not be aligned with respect to each other (i.e., offset) in the direction 208.

FIG. 7 also shows the substrate 220 comprising a metal layer 223 between a dielectric layer 222 and a dielectric layer 224. The substrate 220 may include, inter alia, a chip carrier or a circuit card. The metal layer 223 in the example of FIG. 7 is internal to the substrate 220 and includes electrically conductive metal 221 such as, inter alia, copper, alloy 42, aluminum, etc. Alternatively, the metal layer 123 may located on an external surface (e.g. a surface 219) of the substrate 20. The metal layer 223 may include any combination of power, signal and ground traces. The dielectric layers 222 and 224 each comprise a dielectric material 275, such as, inter alia, polyimide, epoxy-glass composite, FR4, alumina, ceramic, polytetrafluoroethylene, BT resin, etc. While 2 dielectric layers and 1 metal layer are shown for the substrate 220 in FIG. 7, the substrate 220 may include any number of dielectric layers and metal layers, and the metal layers may include any combination of power planes, ground planes, and signal planes. The substrate 220 may also include any number of electrically conductive interconnects (e.g., conductively plated/filled through holes or blind vias) as are known to persons of ordinary skill in the art.

The substrate 220 may be electrically coupled to the signal line/pad 229 on an uncovered portion of the surface 219 of the substrate 220 by the electrically conductive interconnect 228. An electrical connector 209 may electrically couple the signal line/pad 229 to any desired electrically conductive structure, such as, inter alia, an electrical device 207 (e.g., an input/output device). Therefore, the logic chip 215 may be directly electrically coupled to the substrate 220 and to the external device connected to the signal line/pad 229 by being coupled to the substrate 220 as described supra and then through: the via 250, the metal 221, the interconnect 228, and the signal line/pad 229. Similarly, the logic chip 216 may be directly electrically coupled to the substrate 220 and to an external device connected to the signal line/pad 229 by being coupled to the substrate 220 as described supra and then through: the via 252, the metal 221, the electrically conductive interconnect 228, and the signal line/pad 229.

FIG. 7 also shows an underfill 211 encapsulating the solder balls 230, 240, 234, 237, and 245. The underfill 211 serves to provide structural support for the solder balls 230, 240, 234, 237, and 245 particularly when the solder balls 230, 240, 234, 237, and 245 are subject to thermally induced stresses.

The electrical structure 210 of FIG. 7 also includes an upper stiffener 225 and a lower stiffener 226, each including plastic material that is molded to the substrate 220. The upper stiffener 225 and the lower stiffener 226 provide structural stability to the substrate 220. Alternatively the stiffeners 225 and 226 may each be adhesively coupled to the substrate 220 by use of adhesive layers such as the adhesive layers 17 and 48 that coupled the stiffeners 25 and 26, respectively, to the substrate 20 of FIG. 1. If the stiffeners 225 and 226 of FIG. 7 are adhesively coupled to the substrate 220 by adhesive layers, such adhesive layers may have any of the characteristics described supra for the adhesive layers 17 and 48 of FIG. 1. The stiffeners 225 and 226 may include any of the features and materials (metal or plastic) described supra for the stiffeners 25 and 26 of FIG. 1.

FIG. 8 depicts a top view of the electrical structure 210 and shows the line 7—7 line used to defined the cross-sectional side view of FIG. 7. FIG. 8 shows a first group of logic chips 213, 214, 215, and 216 organized as an array of square logic chips, each of said logic chips 213–216 connected to the common, shared memory chip 212 (not shown in FIG. 8 but shown in FIG. 7 for the logic chips 215 and 216, and also shown in FIG. 9). A portion of the underfill 211 is shown in FIG. 8 as surrounding the logic chips 213–216, and being surrounded by a portion of the substrate 220. FIG. 8 also shows a second group of logic chips 203, 204, 205, and 206 organized as an array of square logic chips, each of said logic chips 203–206 connected to a common, shared memory chip 218 (not shown in FIG. 8 but shown in FIG. 9). A portion of the underfill 211 is shown in FIG. 8 as surrounding the logic chips 203–206, and being surrounded by a portion of the substrate 220. The upper stiffener 225 is shown as having cavities into which the first group of logic chips 213–216 and the second group of logic chips 203–206 have been placed.

FIG. 9 depicts a bottom view of the electrical structure 210 showing the memory chip 212 which is underneath the first group of logic chips 213–216, and the memory chip 218 which is underneath the second group of logic chips 203–206 (see FIG. 8). The lower stiffener 226 is shown as having cavities into which the memory chips 212 and 218 have been placed. The signal line/pad 229, the electrical connector 209, and electrical device 207 (see FIG. 7) have been omitted from FIG. 9.

The electrical structure 210 may have attached heat sinks or cover plates from above and below. Such heat sinks or cover plates have been omitted from FIGS. 8 and 9, but are illustrated in FIG. 10 (to be described infra).

Returning to FIG. 7, the solder balls 230, 245, and 240 are subject to thermally induced stress during operation due to a difference in CTE between the substrate 220 and the logic chips 215 and 216, respectively. Similarly, the solder balls 234 and 237 are subject to thermally induced stress during operation due to a difference in CTE between the substrate 220 and the memory chip 212. The thermally induced stresses threaten the structural integrity of the electrical coupling of: the solder ball 230 to the substrate 220 and to the logic chip 215, the solder ball 240 to the substrate 220 and to the logic chip 216, the solder ball 245 to the substrate 220 and to the logic chip 215, the solder ball 234 to the substrate 220 and to the memory chip 212, and the solder ball 237 to the substrate 220 and to the memory chip 212. The present invention mitigates such thermally induced stresses by constraining the substrate 220 with one of the stiffeners 225 or 226. The CTE of the stiffeners 225 and 226 must nearly match that of the memory chip 212 and logic chips 213–216 (see FIG. 8). A CTE range of 6 to 10 ppm/° C. for the stiffeners 225 and 226 will provide satisfactory fatigue life for most applications if the memory chip 212 and the at least two logic chips 215 and 216 each have a CTE between about 3 and 6 ppm/° C. Thus, the stiffeners 225 and 226, as molded to the substrate 220, may include a plastic material that has a CTE between about 6 and 10 ppm/° C., such as inter alia, CEL-9200-XU molding compound from Hitachi Ltd. If the stiffeners 225 and 226 are coupled to the substrate 220 by adhesive layers (e.g., the adhesive layers 17 and 48 of FIG. 1), then the stiffeners 225 and 226 may include such materials as, inter alia, Invar, alloy 42, 420 stainless steel, AlSiC, or a low expansion plastic, each of which having a CTE between about 6 and 10 ppm/° C. The stiffeners 225 and 226 may comprise a same material or a different material.

The electrical structure 210 of FIGS. 7–9 may be assembled as follows. The stiffeners 225 and 226 are attached, adhesively or by molding, to the substrate 220. The memory chip 212 and logic chips 215 and 216 may be attached to the substrate 220 by, inter alia, soldering the solder balls 230, 240, 245, 234, 237, etc. or by the use of conductive adhesive. The solder balls 230, 240, 245, 234, 237, etc. are encapsulated by the underfill 211. Heat sinks (see FIG. 10) may be added to both sides or surfaces of the electrical structure 210. A feature of the assembly method for FIGS. 7–9, as compared with the assembly method for FIGS. 1–3 and FIGS. 4–6, is that there is no need for excising or ablating the substrate 220 in the assembly method for FIGS. 7–9.

FIG. 10 depicts an electrical package 50, comprising an electrical structure 52 plugged into a socket 54 of a backplane 56, in accordance with embodiments of the present invention. In this FIG. 10, the socket 54 is shown as an edge connector but any type of connector known to one of ordinary skill in the art may be used. The electrical structure 52 may comprise, inter alia, an electronic module, a circuit card, the electrical structure 10 of FIGS. 1–3, the electrical structure 110 of FIGS. 4–6, the electrical structure 210 of FIGS. 7–9, etc. Heat sinks 58 are shown on surfaces 61 and 62 of the electrical structure 52.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
   a circuitized substrate comprising a dielectric material and at least one metal layer;
   a first stiffener coupled to a first surface of the substrate, wherein the first stiffener includes a first stiffener material;
   a second stiffener coupled to a second surface of the substrate, wherein the second stiffener includes a second stiffener material;
   a semiconductor memory chip; and
   N semiconductor logic chips such that N is at least 2,
      wherein each logic chip is electrically coupled to the memory chip by a direct interconnect path that includes a corresponding conductive member,
      wherein the corresponding conductive member is in electrical and mechanical contact with both an electrically conductive pad on a surface of the corresponding logic chip and a corresponding electrically conductive pad on a surface of the memory chip,
      wherein at least one chip selected from the group consisting of the memory chip, a first logic chip of the N logic chips, a second logic chip of the N logic chips, . . . , a $N^{th}$ logic chip of the N logic chips, and combinations thereof, is electrically coupled to the substrate by corresponding solder interconnects, and
      wherein each solder interconnect of the corresponding solder interconnects is in electrical and mechanical contact with both an electrically conductive pad on a surface of the substrate and an electrically conductive pad on a surface of the corresponding chip of the at least one chip.

2. The electrical structure of claim 1, wherein the at least one chip includes the memory chip and does not include any of the logic chips.

3. The electrical structure of claim 1, wherein the at least one chip includes the first logic chip and does not include the memory chip.

4. The electrical structure of claim 1, wherein the conductive member includes a Controlled Collapse Chip Connection (C4) solder ball, and wherein each solder interconnect includes a C4 solder ball.

5. The electrical structure of claim 1, wherein the direct interconnect path has a length of no more than about 4 mils.

6. The electrical structure of claim 1, wherein the first stiffener is coupled to the first surface by a first adhesive layer, and wherein the second stiffener is coupled to the second surface by a second adhesive layer.

7. The electrical structure of claim 1, further comprising:
   an electrical device; and
   an electrical contact on the uncovered portion of the first surface of the substrate, wherein the electrical device is electrically coupled to the electrical contact, wherein a first chip of the at least one chip is electrically coupled to the electrical contact and to the electrical device, and wherein the electrical contact is selected from the group consisting of a signal line and a pad that is electrically conductive.

8. The electrical structure of claim 1, wherein the first stiffener includes a first stiffener material having a coefficient of thermal expansion (CTE) that is in a range of 6 to 10 ppm/° C., and the second stiffener includes a second stiffener material having a CTE that is in the range of 6 to 10 ppm/° C.

9. The electrical structure of claim 1, wherein the substrate has thickness less than about 3 mils.

10. The electrical structure of claim 1, wherein the substrate has an in-plane stiffness per unit length and width of less than about $1.5 \times 10^9$ gm/sec$^2$.

11. An electrical structure, comprising:
    a circuitized substrate comprising dielectric material and at least one metal layer;
    a first stiffener coupled to a first surface of the substrate, wherein the first stiffener includes a first stiffener material;
    a second stiffener coupled to a second surface of the substrate, wherein the second stiffener includes a second stiffener material;
    a semiconductor memory chip; and
    N semiconductor logic chips such that N is at least 2,
       wherein each logic chip is electrically coupled to the memory chip by a corresponding logic-to-memory path that includes a first conductive member, an electrically conductive via path through the substrate, and a second conductive member,
       wherein the first conductive member and a second conductive member are respectively coupled electrically to opposite ends of the electrically conductive via path,
       wherein the first conductive member is in electrical and mechanical contact with an electrically conductive pad on a surface of the corresponding logic chip,
       wherein the second conductive member is in electrical and mechanical contact with an electrically conductive pad on a surface of the memory chip, and
       wherein each logic chip is electrically coupled to the substrate by at least one of the first conductive member and a third conductive member.

12. The electrical structure of claim 11, wherein the first conductive member includes a first Controlled Collapse Chip Connection (C4) solder ball, wherein the second conductive member includes a second C4 solder ball, and wherein the third conductive member includes a third C4 solder ball.

13. The electrical structure of claim 11, wherein each logic-to-memory path has a length of no more than about 13 mils.

14. The electrical structure of claim 11, wherein the first stiffener is molded to the first surface, and wherein the second stiffener is molded to the second surface.

15. The electrical structure of claim 11, wherein the first stiffener material and the second stiffener material is a same stiffener material.

16. The electrical structure of claim 11, further comprising:
    an electrical device; and
    an electrical contact on the uncovered portion of the first surface of the substrate, wherein the electrical device is electrically coupled to the electrical contact, wherein a first chip of the at least one chip is electrically coupled to the electrical contact and to the electrical device, and wherein the electrical contact is selected from the group consisting of a signal line and a pad that is electrically conductive.

17. The electrical structure of claim 11, wherein the first stiffener includes a first stiffener material having a coefficient of thermal expansion (CTE) that is in a range of 6 to 10 ppm/° C., and the second stiffener includes a second stiffener material having a CTE that is in the range of 6 to 10 ppm/° C.

18. The electrical structure of claim 11, wherein the substrate has thickness less than about 3 mils.

19. The electrical structure of claim 11, wherein the substrate has an in-plane stiffness per unit length and width of less than about $1.5 \times 10^9$ gm/sec$^2$.

20. An electrical package, comprising a circuit card, an electrical structure plugged into a socket of a backplane of the circuit card, and a plurality of heat sinks distributed on at least one surface selected from the group consisting of a first surface of the electrical structure, a second surface of the electrical structure, and a combination thereof, wherein the electrical structure comprises:

a circuitized substrate comprising a dielectric material and at least one metal layer;

a first stiffener coupled to a first surface of the substrate, wherein the first stiffener includes a first stiffener material;

a second stiffener coupled to a second surface of the substrate, wherein the second stiffener includes a second stiffener material;

a semiconductor memory chip; and

N semiconductor logic chips wherein N is at least 2, wherein each logic chip is electrically coupled to the memory chip by a direct interconnect path that includes a corresponding conductive member, wherein the corresponding conductive member is in electrical and mechanical contact with both an electrically conductive pad on a surface of the corresponding logic chip and a corresponding electrically conductive pad on a surface of the memory chip, wherein at least one chip selected from the group consisting of the memory chip, a first logic chip of the logic chips, a second logic chip of the logic chips, ..., a $N^{th}$ logic chip of the N logic chips, and combinations thereof, is electrically coupled to the substrate by corresponding solder interconnects, and wherein each solder interconnect of the corresponding solder interconnects is in electrical and mechanical contact with both an electrically conductive pad on a surface of the substrate and an electrically conductive pad on a surface of the corresponding chip of the at least one chip.

* * * * *